United States Patent [19]

Milkovic

[11] Patent Number: 4,942,367
[45] Date of Patent: Jul. 17, 1990

[54] AUTO-ZEROING SWITCHED-CAPACITANCE BUFFER AMPLIFIERS WITH MINUS-UNITY VOLTAGE GAIN

[75] Inventor: Miran Milkovic, Scotia, N.Y.

[73] Assignee: General Electric Company, Schenectady, N.Y.

[21] Appl. No.: 414,508

[22] Filed: Sep. 29, 1989

[51] Int. Cl.⁵ .............................................. H03F 1/02
[52] U.S. Cl. .......................................... 330/9; 330/51; 330/301
[58] Field of Search ...................... 330/9, 51, 275, 301; 307/353, 520; 318/165

[56] References Cited

U.S. PATENT DOCUMENTS 4,543,534  9/1985  Temes et al. ...................... 330/51 X

OTHER PUBLICATIONS

"Switched-Capacitor Neural Networks", Electronics Letters, vol. 23, No. 18, pp. 958-959, 27 Aug. 1987.
"High-Frequency Switched-Capacitor Filter Using Unity Gain Buffers", A delaPlaza, IEEE Journal of Solid State Circuits, vol. SC-21, No. 3, pp. 470-477, Jun. 1986.

Primary Examiner—James B Mullins
Attorney, Agent, or Firm—Allen L. Limberg; James C. Davis, Jr.; Marvin Snyder

[57] ABSTRACT

A switched-capacitance amplifier has a common terminal and an input signal terminal for receiving an input signal voltage therebetween, and it has an inverted output signal terminal for supplying, during each of a second series of separated time intervals interleaved without overlap with a first series of separated time intervals, an output voltage that is the negative of its input signal voltage. The switched-capacitance amplifier includes first and second capacitors. The switched-capacitance amplifier also includes a differential-input amplifier, having an output connection to the inverted output signal terminal, having a non-inverting input connection to the common terminal, having an inverting input connection, and having an input port between its non-inverting and inverting input connections. During each of the first series of separated time intervals the first and second plates of the first capacitor are respectively connected to the common terminal and to the input signal terminal, for charging the first capacitor to the input signal voltage; and the first and second plates of the second capacitor are respectively connected to the common terminal and to the inverting input connection of the differential-input amplifier, for charging the second capacitor to the input offset voltage error of that amplifier. During each of the second series of separated time intervals the first capacitor, the second capcitor and the input port of the differential input amplifier are connected in series between the inverted output signal terminal and the common terminal.

13 Claims, 4 Drawing Sheets

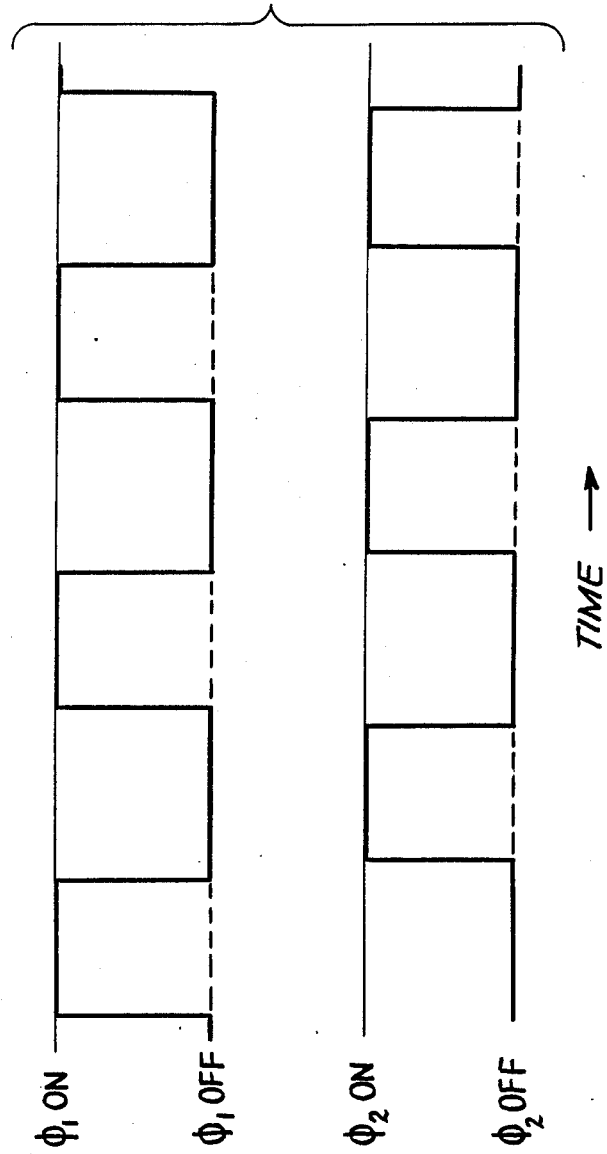

AUTO-ZEROING SWITCHED-CAPACITANCE BUFFER AMPLIFIERS WITH MINUS-UNITY VOLTAGE GAIN

The invention relates to switched-capacitance amplifiers and, more particularly, to auto-zeroed such amplifiers that provide minus-unity voltage gain without need for precisely proportioned elements and that are suitable for buffer amplification.

BACKGROUND OF THE INVENTION

Switched-capacitance amplifiers for responding to a single-ended input signal to provide balanced signal drive to a pair of capacitively loaded lines are of interest in certain applications such as neural nets, array multipliers, switched-capacitance filters and charge coupled device (CCD) filters. Auto-zeroed switched-capacitance amplifiers having plus-unity voltage gain independent of element values and being suitable for buffer amplification are known in the art. An auto-zeroed switched-capacitance amplifier having minus-unity voltage gain independent of element values and being suitable for buffer amplification is an objective of the invention. Such an amplifier paired with an auto-zeroed switched-capacitance amplifier having plus-unity voltage gain independent of element values provides for the desired buffer amplifier to drive balanced signals into a pair of capacitively loaded lines.

SUMMARY OF THE INVENTION

A switched-capacitance amplifier has a common terminal and an input signal terminal for receiving an input signal voltage therebetween, and it has an inverted output signal terminal for supplying, during each of a second series of separated time intervals interleaved without overlap with a first series of separated time intervals, an output voltage that is the negative of its input signal voltage. The switched-capacitance amplifier includes first and second capacitors. The switched-capacitance amplifier also includes a differential-input amplifier, having an output connection to the inverted output signal terminal, having a non-inverting input connection to the common terminal, having an inverting input connection, and having an input port between its non-inverting and inverting input connections. During each of the first series of separated time intervals the first and second plates of the first capacitor are respectively connected to the common terminal and to the input signal terminal, for charging the first capacitor to the input signal voltage; and the first and second plates of the second capacitor are respectively connected to the common terminal and to the inverting input connection of the differential-input amplifier, for charging the second capacitor to the input offset voltage error of that amplifier. During each of the second series of separated time intervals the first capacitor, the second capacitor and the input port of the differential input amplifier are connected in series between the inverted output signal terminal and the common terminal.

Figure 2:
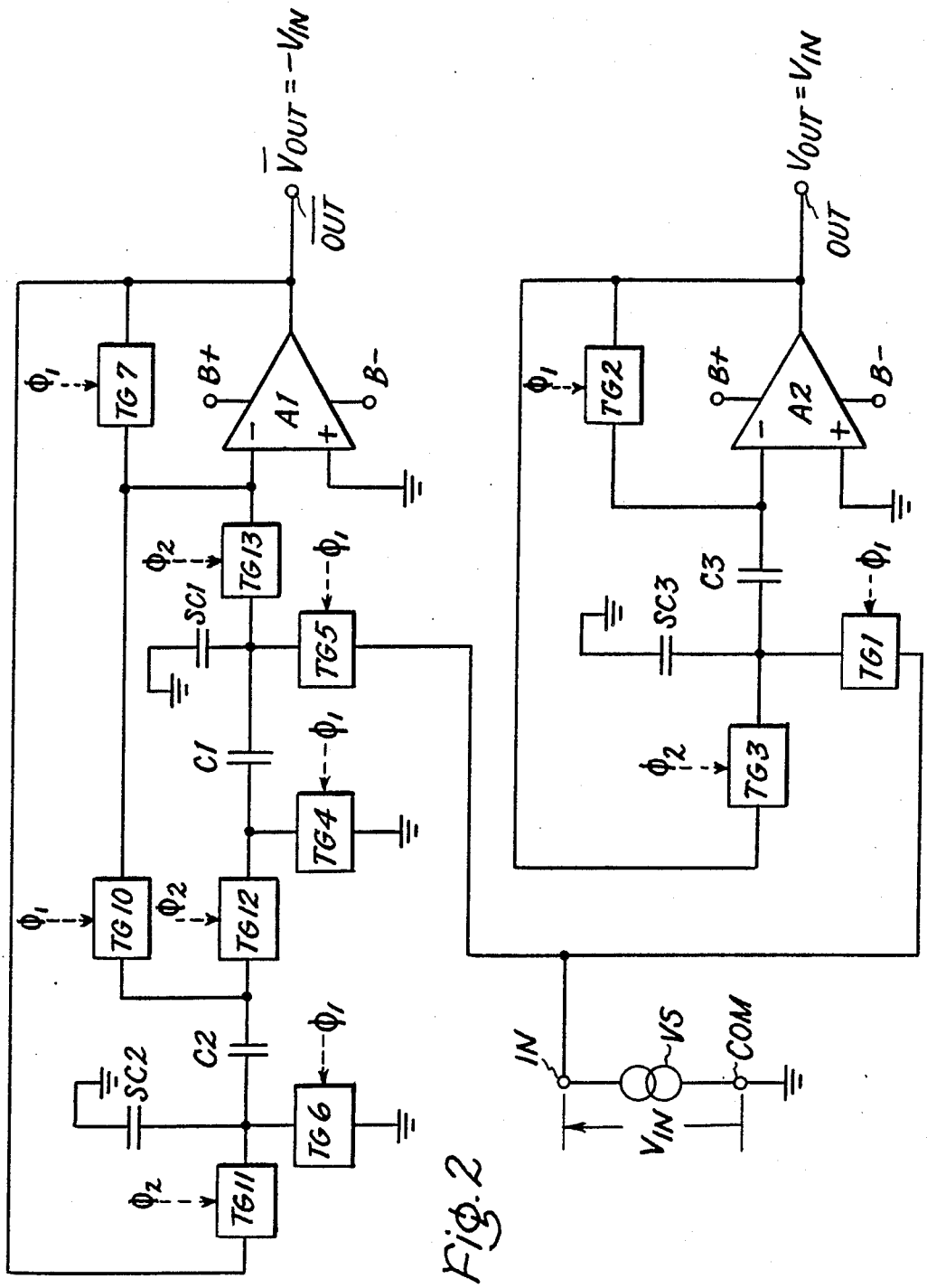
Figure 3:
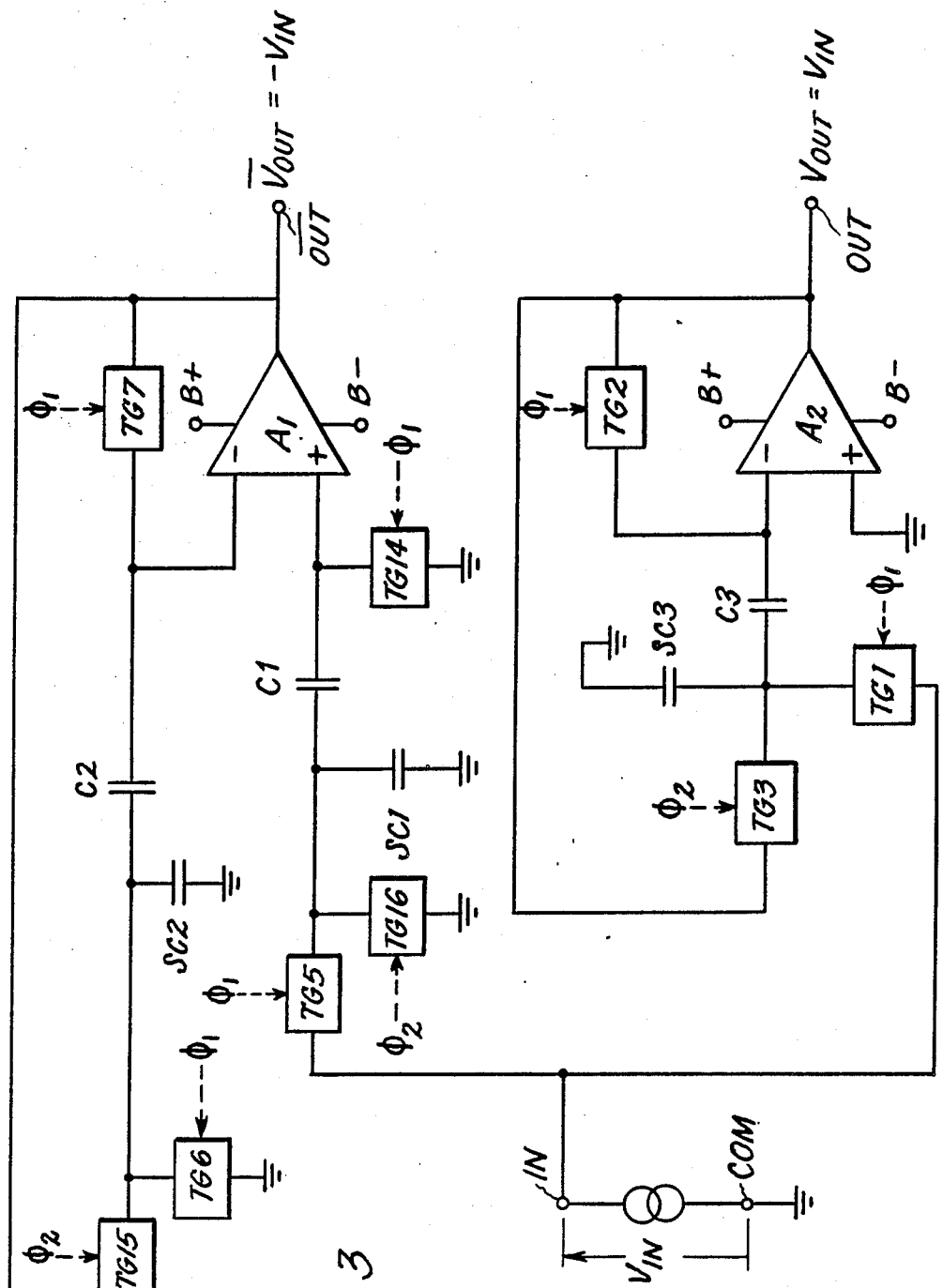

Each of FIGS. 2 and 3 is a schematic diagram of an alternative embodiment of the invention.

FIG. 4 is a timing diagram of control voltages for any of the embodiments of the invention shown in the lower-numbered figures of the drawing.

DETAILED DESCRIPTION

Figure 1:
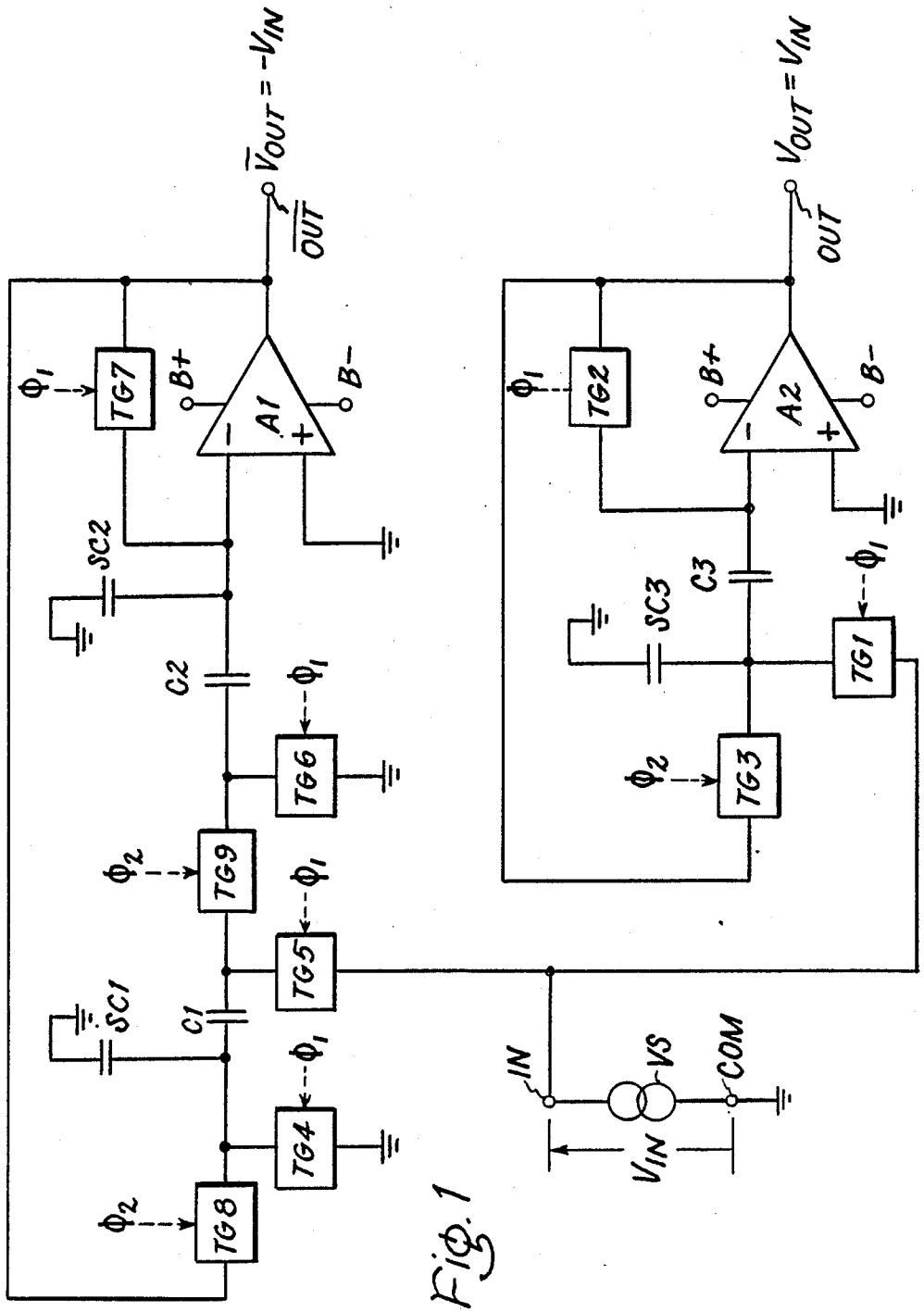
FIG. 1 is a schematic diagram of an embodiment of the invention.

Each of the switched-capacitance amplifiers of FIGS. 1, 2 and 3 includes transmission gates represented by rectangular boxes containing the letter TG in their identifying symbols. Each transmission gate is controlled by a control signal $\emptyset_1$ or $\emptyset_2$, being conductive when that control signal is in an "ON", "high" or "logic ONE" condition and being non-conductive when that control signal is in an "OFF", "low" or "logic ZERO" condition. As shown in the FIG. 4 timing diagram, plotting values of control signals $\emptyset_1$ and $\emptyset_2$ on respective vertical axes versus the same (horizontal) time axis, control signal $\emptyset_1$ is in its "ON" condition only during a first series of separated time intervals; and control signal $\emptyset_2$ is in its "ON" condition only during a second series of separated time intervals interleaved without overlap with the first series of separated time intervals. As known from the prior art a transmission gate may be formed from a field effect transistor receiving a control voltage at its gate electrode, for example, or may be formed from a pair of field effect transistors of complementary conductivity types having paralleled channels and having gate electrodes receptive of opposite-polarity control voltages.

Each of the switched-capacitance amplifiers of FIGS. 1, 2 and 3 includes a pair of differential-input amplifiers A1 and A2, each of which responds to differences in the voltages applied to its respective non-inverting (+) and inverting (−) input connections to generate a response at an output connection thereof. Amplifiers A1 and A2 are shown as being supplied a positive operating supply voltage (B+) and a negative operating supply voltage (B-) respective to a ground potential applied to their non-inverting input connections, and their output connections are capable of swinging over most of a voltage range bounded by the Band B+ operating supply voltages. Each of the switched-capacitance amplifiers of FIGS. 1, 2 and 3 employ first, second and third capacitors C1, C2 and C3; and both of these switched-capacitance amplifiers are likely to be constructed in monolithic integrated circuit form. In such case capacitors C1, C2 and C3 tend to have respective stray capacitances SC1, SC2 and SC3 of substantial values from ones of their plates to the integrated circuit substrate, which are electrically equivalent to capacitances to ground.

In each of the FIG. 1, FIG. 2 and FIG. 3 switched-capacitance amplifiers, an output signal voltage $V_{OUT}$—the same as $V_{IN}$ in polarity and substantially the same as $V_{IN}$ in magnitude—is developed at terminal OUT $\emptyset_2$ control signal is high. This is done by operating elements VS, A2, C3, TG1, TG2 and TG3 as follows. During each of first series of separated time intervals responsive to control signal $\emptyset_1$ being high, a transmission gate TG1 is rendered conductive to apply the voltage $V_{IN}$ to a first plate of the capacitor C3. Also, responsive to control signal $\emptyset_1$ being high, a transmission gate TG2 is rendered conductive to provide direct-coupled degenerative feedback from the output connection of amplifier A2 to its inverting input connection. The degenerative feedback around amplifier A2 reduces the voltage difference between its non-inverting and inverting input connections, nominally to zero volts, and actually to the input offset error voltage $V_{IOE2}$ of amplifier A2 as multiplied by minus one. (Input offset error voltages are presumed to be measured at the non-inverting input connection of a differential-input amplifier as referred to the potential at the inverting input connection). That is, the second plate of capacitor C3 is clamped within $-V_{IOE2}$ of ground potential, while its first plate is clamped (by conduction of transmission gate TG1) to $V_{IN}$ potential. Capacitor C3 changes its charge condition as necessary to store $V_{IN}+V_{IOE2}$ voltage between its second and first plates. A transmission gate TG3 is non-conductive between terminal OUT at the output connection of amplifier A2 and the first plate of capacitor C3 while capacitor C3 is clamped for charging responsive to $\emptyset_1$ control signal being high. Thereafter, $\emptyset_1$ control signal goes low, rendering transmission gates TG1 and TG2 non-conductive. Then $\emptyset_2$ control signal goes high, rendering transmission gate TG3 conductive to complete a degenerative feedback loop from the output connection of amplifier A2 through capacitor C3 to the inverting input connection of amplifier A2. This feedback loop reduces the source impedance at both the output and inverting input connections of amplifier A2, so that there is negligible effect upon loop operation attributable to stray capacitance (e.g., SC3 associated with capacitor C3). Capacitor C3 holds the voltage $(V_{IN}+V_{IOE2})$ and the loop stabilizes when that voltage added to $-V_{IOE2}$ at the inverting input connection of amplifier A2 appears at terminal OUT. That is, during each of the second series of time intervals, when control voltage $\emptyset_2$ is high, a potential $V_{OUT}$ equal to $V_{IN}$ appears at terminal OUT.

In FIG. 1 a potential $\overline{V}_{OUT}$ equal to $V_{IN}$ magnitude, but opposite in sign, is in accordance with an aspect of the invention developed at terminal $\overline{OUT}$ during each of the second series of separated time intervals, when $\emptyset_2$ control signal is high. This is done as follows. During each of the first series of separated time intervals, responsive to $\emptyset_1$ control signal being high, a transmission gate TG4 is rendered conductive to clamp the first plate of capacitor C1 to ground. Also responsive to control signal $\emptyset_1$ being high, a transmission gate TG5 is rendered conductive to clamp the second plate of capacitor C1 to $V_{IN}$ potential as supplied from voltage source VS. Capacitor C1 adjusts its charge as necessary to store $V_{IN}$ between its first and second plates. Also responsive to control signal $\emptyset_1$ being high, a transmission gate TG6 is rendered conductive to clamp the first plate of capacitor C2 to ground potential. Also, responsive to control signal $\emptyset_1$ being high, a transmission gate TG7 is rendered conductive to complete a direct-coupled degenerative feedback connection from the output connection of amplifier A1 to its inverting input connection. This feedback drives the inverting input connection to the negative of the input offset error voltage $-V_{10E1}$ of amplifier A1. Capacitor C2 adjusts the charge stored between its first and second plates as necessary to store $+V_{10E1}$ therebetween. After capacitors C1 and C2 adjust their respective charge conditions, $\emptyset_1$ control signal goes low to render transmission gates TG4, TG5, TG6 and TG7 non-conductive. Some time thereafter, $\emptyset_2$ control signal goes high, rendering transmission gates TG8 and TG9 conductive to complete a degenerative feedback loop from the output connection of amplifier A1 to its inverting input connection through the series connection of capacitors C1 and C2. The series connection of capacitors C1 and C2 hold the voltage $-V_{IN}+V_{IOE1}$ between inverting input connection and output connection of amplifier A1 forcing the degenerative feedback loop to stabilize the potential $\overline{V}_{OUT}$ at terminal $\overline{OUT}$ to be the input offset error voltage $V_{IOE1}$ between the non-inverting and inverting input terminals of amplifier A1 plus that voltage held by the series connection of capacitors C1 and C2. That is $\overline{V}_{OUT}=-V_{IN}$ during each of said second series of separated time intervals. In the FIG. 1 switched-capacitance amplifier the second plate of capacitor C2 connects to the inverting input connection of amplifier A1 both when $\emptyset_1$ is high and when $\emptyset_2$ is high. This saves two transmission gates as compared to an alternative embodiment of the invention.

In the FIG. 2 switched-capacitance amplifier the series connection of capacitors C1 and C2 when control signal $\emptyset_2$ is high is made in opposite order as it is in the FIG. 1 switched-capacitance amplifier. This necessitates the addition of a transmission gate TG10 to connect the second plate of capacitor C2 to the inverting input connection of amplifier A1 during the charging of C2. C2 charges to store $+V_{10E1}$ between its first and second plates when control signal $\emptyset_1$ is high during each of the first series of separated time intervals. Three transmission gates TG11, TG12 and TG13 rendered conductive response to control signal $\emptyset_2$ being high are required, to complete the series connection of capacitors C1 and C2 during each of the second series of separated time intervals, rather than just the two transmission gates TG8 and TG9 of the FIG. 1 switched-capacitance amplifier.

Note that in both the FIG. 1 and FIG. 2 switched-capacitance amplifiers, stray capacitances SC1 and SC2 are preferably located, so they are not in the feedback loop. Then SC1 and SC2 are not afforded the Miller multiplication that the capacitances of capacitors C1 and C2 are.

In the FIG. 3 switched-capacitance amplifier, capacitor C1 is charged to store $V_{IN}$ and capacitor C2 is charged to store $-V_{10E1}$ during each of the first series of separated time intervals, when control signal $\emptyset_1$ is high. This is done in substantially the same way as in the FIG. 1 switched-capacitance amplifier. Control signal $\emptyset_1$ being high conditions a transmission gate TG14 to be conductive to clamp a first plate of capacitor C1 to ground potential, while charging capacitor C1 to store the input voltage $V_{IN}$ between its first and second plates. Conduction of transmission gate TG14 also clamps the non-inverting input connection of amplifier A1 to ground potential while capacitor C2 is being charged to store $-V_{10E1}$. During each succeeding one of the second series of separated time intervals, a transmission gate TG15 responds to control signal $\emptyset_2$ being high to connect capacitor C2 between the output and inverting input connections of amplifier A1 to provide a potential follower for signals applied to the non-inverting input connection of amplifier A1. This potential follower has input offset error voltage compensation afforded by the $V_{10E1}$ voltage stored on capacitor C2. Control signal $\emptyset_2$ being high also conditions a transmission gate 16 to be conductive to clamp the first plate of capacitor C1 to ground potential so its second plate applies $-V_{IN}$ potential to the non-inverting input connection of amplifier A1. Since amplifier A1 is conditioned to be a zero-offset potential follower in the FIG. 3 switched-capacitance amplifier during each of the second series of separated time intervals, as previously noted, the $-V_{IN}$ potential is supplied at low source impedance from the output connection of amplifier A1 to terminal $\overline{OUT}$.

The FIG. 3 switched-capacitance amplifier has as few transmission gates as the FIG. 1 switched-capacitance amplifier. The capacitance of C1 should be substantially larger than stray capacitance at the non-inverting input connection of amplifier A1, such as may be afforded by non-conductive transmission gate TG14. This is the reason for locating stray capacitance SC1 where it is short-circuited by conduction of transmission gate TG16. Locating stray capacitance SC2 to be shunted by the low source impedance of amplifier A1 is also advisable.

One skilled in the art will be enabled by the foregoing disclosure to design variants of the invention described therein and this should be borne in mind when construing the scope of the claims which follow.

What is claimed is:

1. A switched-capacitance amplifier comprising:
    a common terminal for receiving a reference voltage;
    an input signal terminal for receiving an input signal voltage as referred to said reference voltage;
    an inverted output signal terminal for supplying, during each of a second series of separated time intervals interleaved without overlap with a first series of separated time intervals, an inverted output signal voltage that is the negative of the voltage at said input signal terminal, as referred to said reference voltage;
    first and second capacitors, each having respective first and second plates;
    a first differential-input amplifier having an output connection to said inverted output signal terminal, having a non-inverting input connection to said common terminal, having an inverting input connection, and having an input port between its non-inverting and inverting input connections with which an input offset error voltage is associated;
    first selective connection means for connecting, during each of said first series of separated time intervals, the first and second plates of said first capacitor respectively to said common terminal and to said input signal terminal, for charging said first capacitor to said input signal voltage;
    second selective connection means for connecting, during each of said first series of separated time intervals, the first and second plates of said second capacitor respectively to said common terminal and to the inverting input connection of said first differential-input amplifier, for charging said second capacitor to the input effect error voltage of said first differential-input amplifier; and
    third selective connection means for connecting during each of said second series of separated time intervals said first capacitor, said second capacitor and the input port of said first differential-input amplifier in a first series connection between said inverted output signal terminal and said common terminal.

2. A switched-capacitance amplifier as set forth in claim 1 further comprising:
    a non-inverted output signal terminal for supplying another output signal voltage that is the same as the voltage at said input terminal;
    a third capacitor having respective first and second plates;
    means for connecting, only during each of said first series of separated time intervals, the first and second plates of said third capacitor respectively to said input signal terminal and to said non-inverted output signal terminal;
    means for connecting, only during each of said second series of separated time intervals the first plate of said third capacitor to said non-inverted output signal terminal; and
    a second differential-input amplifier having an output connection to said non-inverted output signal terminal, having a non-inverting input connection to said common terminal, and having an inverting input connection from the second plate of said third capacitor.

3. A switched-capacitance amplifier as set forth in claim 1 wherein said third selective connection means includes the non-inverting input connection of said first differential-input amplifier being continually to said common terminal.

4. A switched-capacitance amplifier as set forth in claim 3 wherein said third selective connection means further includes:
    fourth selective connection means for serially connecting, during each of said second series of separated time intervals said first and second capacitors, with the first plate of one connecting from said inverted output signal terminal, with the second plate of said one connecting to the first plate of the other, and with the second plate of the other connecting to the inverting input connection of said first differential-input amplifier.

5. A switched-capacitance amplifier as set forth in claim 4 further comprising:
    a non-inverted output signal terminal for supplying another output signal voltage that is the same as the voltage at said input terminal;
    a third capacitor having respective first and second plates;
    means for connecting, only during each of said first series of separated time intervals, the first and second plates of said third capacitor respectively to said input signal terminal and to said non-inverted output signal terminal;
    means for connecting, only during each of said second series of separated time intervals the first plate of said third capacitor to said non-inverted output signal terminal; and
    a second differential-input amplifier having an output connection to said non-inverted output signal terminal, having a non-inverting input connection to said common terminal, and having an inverting input connection from the second plate of said third capacitor.

6. A switched-capacitance as set forth in claim 1 wherein said third selective connection means includes the inverting input connection of said first differential-input amplifier being continually to the second plate of said second capacitor.

7. A switched-capacitance amplifier as set forth in claim 6 further comprising:
    a non-inverted output signal terminal for supplying another output signal voltage that is the as the voltage at said input terminal;
    a third capacitor having respective and second plates;
    means for connecting, only during each of said first series of separated time intervals, the first and second plates of said third capacitor respectively to said input signal terminal and to said non-inverted output signal terminal;

means for connecting, only during each of said second series of separated time intervals the first plate of said third capacitor to said non-inverted output signal terminal; and a second differential-input amplifier having an output connection to said non-inverted output signal terminal, having a non-inverting input connection to said common terminal and having an inverting input connection from the second plate of said third capacitor.

8. A switched-capacitance amplifier comprising:

a common terminal and an input signal terminal for receiving an input signal voltage therebetween;

an inverted output signal voltage terminal for supplying, during each of a second series of separated time intervals interleaved without overlap with a first series of separated time intervals, an inverted output signal voltage that is the negative of the voltage at said input signal terminal, as referred to the voltage at said common terminal;

first and second capacitors, each having respective first and second plates;

means for connecting, only during each of said first series of time intervals, the first plates of said first and second capacitors each to said common terminal, the second plate of said first capacitor from said input signal terminal, and the second plate of said second capacitor from said inverted output signal terminal;

means for connecting, only during each of said second series of separated time intervals, the first plate of said first capacitor from said inverted output signal terminal, and second plate of said first capacitor to the first plate of said second capacitor; and a first differential-input amplifier having an output connection to said inverted output signal terminal, having a non-inverting input connection from said common terminal and having an inverting input connection from the second plate of said second capacitor.

9. A switched-capacitance amplifier as set forth in claim 8 further comprising:

a non-inverted output signal terminal for supplying another output signal voltage that is the same as the voltage at said input terminal;

a third capacitor having respective first and second plates;

means for connecting, only during each of said first series of separated time intervals, the first and second plates of said third capacitor respectively to said input signal terminal and to said non-inverted output signal terminal;

means for connecting, only during each of said second series of separated time intervals the first plate of said third capacitor to said non-inverted output signal terminal; and a second differential-input amplifier having an output connection to said non-inverted output signal terminal, having a non-inverting input connection to said common terminal and having an inverting input connection from the second plate of said third capacitor.

10. A switched-capacitance amplifier comprising:

a common terminal and an input signal terminal for receiving an input signal voltage therebetween;

an inverted output signal terminal for supplying, during each of a second series of separated time intervals interleaved without overlap with a first series of separated time intervals, an inverted output signal voltage that is the negative of the voltage at said input signal terminal, as referred to the voltage at said common terminal;

first and second capacitors, each having respective first and second plates;

a first differential-input amplifier having an output connection to said inverted output signal terminal, having a non-inverting input connection from said common terminal and having an inverting input connection;

means for connecting, only during each of said first series of time intervals, the first plates of said first and second capacitors each to said common terminal, the second plate of said first capacitor from said input signal terminal, and the inverting input connection of said first differential-input amplifier both from the output connection of said first differential-input amplifier and to the second plate of said second capacitor; and means for connecting, only during each of said second series of separated time intervals, the first plate of said first capacitor with the second plate of said second capacitor, the second plate of said first capacitor to the inverting input connection of said first differential-input amplifier, and the first plate of said second capacitor from said inverted output signal terminal.

11. A switched-capacitance amplifier as set forth in claim 10 further comprising:

a non-inverted output signal terminal for supplying another output signal voltage that is the same as the voltage at said input terminal;

a third capacitor having respective first and second plates;

means for connecting, only during each of said first series of separated time intervals, the first and second plates of said third capacitor respectively to said input signal terminal and to said non-inverted output signal terminal;

means for connecting, only during each of said second series of separated time intervals the first plate of said third capacitor to said non-inverted output signal terminal; and a second differential-input amplifier having an output connection to said non-inverted output signal terminal, having a non-inverting input connection to said common terminal and having an inverting input connection from the second plate of said third capacitor.

12. A switched-capacitance amplifier comprising:

a common terminal and an input signal terminal for receiving an input signal voltage therebetween;

an inverted output signal terminal for supplying, during each of a second series of separated time intervals interleaved without overlap with a first series of separated time intervals, an inverted output signal voltage that is the negative of the voltage at said input signal terminal, as referred to the voltage at said common terminal;

first and second capacitors, each having respective first and second plates;

a first differential-input amplifier having an output connection to said inverted output signal terminal, having a non-inverting input connection from the first plate of said first capacitor, and having an inverting input connection from the second plate of said second capacitor;

means for connecting, only during each of said first series of separated time intervals, the output connection of said first differential-input amplifier to its inverting input connection, the first plates of said first and second capacitors to said common terminal, and the second plate of said first capacitor from said input signal terminal;

means for connecting, only during each of said second series of time intervals, the output connection of said first differential amplifier to the first plate of said second capacitor; and means for connecting, only during each of said second series of time intervals, the second plate of said first capacitor to said common terminal.

13. A switched-capacitance amplifier as set forth in claim 12 further comprising:

a non-inverted output signal terminal for supplying another output signal voltage that is the same as the voltage at said input terminal;

a third capacitor having respective first and second plates;

means for connecting, only during each of said first series of separated time intervals, the first and second plates of said third capacitor respectively to said input signal terminal and to said non-inverted output signal terminal;

means for connecting, only during each of said second series of separated time intervals the first plate of said third capacitor to said non-inverted output signal terminal; and a second differential-input amplifier having an output connection to said non-inverted output signal terminal, having a non-inverting input connection to said common terminal and having an inverting input connection from the second plate of said third capacitor.

* * * * *